US008930011B2

(12) United States Patent
Heo et al.

(10) Patent No.: US 8,930,011 B2
(45) Date of Patent: Jan. 6, 2015

(54) METHOD OF MEASURING AN OVERLAY OF AN OBJECT

(75) Inventors: Jin-Seok Heo, Suwon-si (KR);
Seok-Hwan Oh, Seoul (KR); Jeong-Ho Yeo, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 361 days.

(21) Appl. No.: 13/107,166

(22) Filed: May 13, 2011

(65) Prior Publication Data

US 2011/0320025 A1 Dec. 29, 2011

(30) Foreign Application Priority Data

Jun. 25, 2010 (KR) ........................ 10-2010-0060352

(51) Int. Cl.
- *G06F 19/00* (2011.01)
- *H01L 21/00* (2006.01)
- *G06K 9/00* (2006.01)
- *G03F 7/20* (2006.01)

(52) U.S. Cl.
CPC .................................. *G03F 7/70633* (2013.01)
USPC ................. 700/121; 382/151; 716/54; 438/7; 438/16

(58) Field of Classification Search
None
See application file for complete search history.

(56) References Cited

U.S. PATENT DOCUMENTS

| 2003/0144813 | A1* | 7/2003 | Takemoto et al. ............ 702/153 |
| 2003/0234823 | A1* | 12/2003 | Sato et al. ..................... 345/848 |
| 2005/0026385 | A1* | 2/2005 | Kim et al. ..................... 438/401 |
| 2005/0031995 | A1* | 2/2005 | Kang et al. .................... 430/311 |
| 2005/0272221 | A1* | 12/2005 | Yen et al. ...................... 438/401 |
| 2006/0073396 | A1* | 4/2006 | Lee et al. .......................... 430/5 |
| 2006/0118974 | A1* | 6/2006 | Kim et al. ..................... 257/797 |
| 2006/0241792 | A1* | 10/2006 | Pretlove et al. ................ 700/83 |
| 2006/0263706 | A1* | 11/2006 | Yim ............................... 430/22 |
| 2007/0077503 | A1* | 4/2007 | Yoo ............................... 430/22 |
| 2008/0052660 | A1* | 2/2008 | Shim et al. ..................... 716/19 |
| 2008/0220375 | A1* | 9/2008 | Kim et al. ..................... 430/315 |
| 2009/0136116 | A1* | 5/2009 | Okai et al. .................... 382/144 |
| 2010/0159617 | A1* | 6/2010 | Kobayashi ....................... 438/7 |

FOREIGN PATENT DOCUMENTS

| JP | 2004-128197 | 4/2004 |
| JP | 2007-311580 | 11/2007 |
| KR | 1020070081511 | 8/2007 |
| KR | 100842496 | 6/2008 |
| KR | 1020090044544 | 5/2009 |
| KR | 1020090054403 | 5/2009 |

* cited by examiner

*Primary Examiner* — Sean Shechtman
(74) *Attorney, Agent, or Firm* — F. Chau & Associates, LLC

(57) ABSTRACT

A method of measuring an overlay of an object is provided. In the method, first information of a first structure may be obtained. A preliminary structure may be formed on the first structure. Second information of the preliminary structure may be obtained. The first information and the second information may be processed to obtain virtual information of a second structure that would be formed on the first structure if a process is performed on the preliminary structure. A virtual overlay between the first structure and the second structure may be measured using the virtual information.

17 Claims, 4 Drawing Sheets

METHOD OF MEASURING AN OVERLAY OF AN OBJECT

CROSS-REFERENCE TO RELATED APPLICATION

This application claims priority under 35 U.S.C. §119 to Korean Patent Application No. 2010-60352, filed on Jun. 25, 2010 in the Korean Intellectual Property Office (KIPO), the disclosure of which is incorporated by reference herein in its entirety.

BACKGROUND

1. Technical Field

Exemplary embodiments of the inventive concept relate to a method of measuring an overlay of an object. More particularly, exemplary embodiments of the inventive concept relate to a method of measuring an overlay of stacked patterns.

2. Discussion of the Related Art

Generally, a plurality of semiconductor fabrication processes is used to form a plurality of lower patterns and upper patterns on a semiconductor substrate. To determine an alignment between an upper pattern and a lower pattern, an overlay between the lower pattern and the upper pattern may be measured.

In an overlay measurement method, the overlay of the lower and upper patterns may be indirectly measured using an alignment mark formed on a scribe lane of the semiconductor substrate. However, the overlay measured in this manner may not accurately represent the overlay of both patterns, since the alignment mark may be off.

In another method, the overlay may be measured using actual images of the lower and upper patterns. This may be more accurate that using the aforementioned alignment mark; however, this method's measurements are obtained after forming the upper pattern. In other words, the actual overlay is measured after a patterning process such as an etching process is performed on an upper layer to form the upper pattern. Therefore, when the overlay measurement indicates that the upper pattern is misaligned with the lower pattern, the upper pattern cannot be realigned, and thus may lead to the disposal of the semiconductor substrate.

SUMMARY

An exemplary embodiment of the inventive concept provides a method of accurately measuring an overlay between a lower layer and an upper layer before performing a process on the upper layer. The upper and lower layers may be formed on a semiconductor substrate or a non-semiconductor structure created by overlapping at least two physical layers.

According to an exemplary embodiment of the inventive concept, there is provided a method of measuring an overlay of an object. In the method of measuring the overlay of the object, first information of a first structure may be obtained. A preliminary structure may be formed on the first structure. Second information of the preliminary structure may be obtained. The first information and the second information may be processed to obtain virtual information of a second structure that would be formed on the first structure if a process is performed on the preliminary structure. A virtual overlay between the first structure and the second structure may be measured using the virtual information.

In an exemplary embodiment of the inventive concept, the method may further include aligning the first structure and the preliminary structure prior to obtaining the second information of the preliminary structure. Aligning the first structure and the preliminary structure may include setting an alignment point, aligning the first structure with respect to the alignment point, and aligning the preliminary structure with respect to the alignment point.

In an exemplary embodiment of the inventive concept, the first structure may include a first patterned layer formed on a semiconductor substrate. The preliminary structure may include a non-patterned layer formed on the first patterned layer. The second structure, once formed, may include a second patterned layer formed by patterning the non-patterned layer.

In an exemplary embodiment of the inventive concept, the first information may include an image of the first structure, the second information may include an image of the preliminary structure and the virtual information may include a virtual image derived from both of these images. The virtual image may be obtained using augmented reality technology.

In an exemplary embodiment of the inventive concept, when the virtual overlay is within an allowable range, the method may further include performing the process on the preliminary structure to form the second structure, obtaining third information of the second structure, measuring an actual overlay between the first structure and the second structure using the first information and the third information, and comparing the actual overlay with the virtual overlay. The third information may include an image of the second structure. The process performed on the preliminary structure to form the second structure may include a semiconductor fabrication process.

When the virtual overlay is not within the allowable range, the preliminary structure may be repaired. In this case, the method may further include repeating the obtaining of the second information, processing and measuring steps using the repaired preliminary structure in place of the original preliminary structure; and forming the second structure if the overlay measured between the first structure and the repaired preliminary structure is within the allowable range.

According to an exemplary embodiment of the inventive concept, there is provided a method of measuring an overlay of an object. In the method of measuring the overlay of the object, a first patterned layer may be aligned with an alignment point. A first image of the first patterned layer may be obtained. A non-patterned layer may be formed on the first patterned layer. The non-patterned layer may be aligned with the alignment point. A second image of the non-patterned layer may be obtained. The first image and the second image may be edited to obtain a virtual image of a structure that would result if a second patterned layer were to be formed by patterning the non-patterned layer in its aligned position on the first patterned layer. A virtual overlay between the first patterned layer and the second patterned layer may be measured using the virtual image.

In an exemplary embodiment of the inventive concept, when the virtual overlay is within an allowable range, the method may further include patterning the non-patterned layer to form the second patterned layer; otherwise, realigning the non-patterned layer until the virtual overlay is within the allowable range.

The first patterned layer may be formed on a semiconductor substrate and the second patterned layer may overlap the first patterned layer. The alignment point may be located on the semiconductor substrate.

According to an exemplary embodiment of the inventive concept, an overlay measurement method is provided. In the method, image data of a first patterned layer formed on a semiconductor substrate may be received, wherein the first patterned layer is aligned with an alignment point corresponding to a coordinate of a device on which the semiconductor substrate is disposed. Image data of a non-patterned layer formed on the first patterned layer may be received. The non-patterned layer may be aligned to the alignment point. The image data of both layers may be processed to produce first data, wherein the first data is indicative of what would occur if the non-patterned layer were patterned in its current location to form a second patterned layer on the first patterned layer. Based on the first data, a first difference in overlay between the second patterned layer and the first patterned layer may be determined. An instruction to form the second patterned layer in response to the first difference being within an allowable range may be output and an instruction to adjust the non-patterned layer in response to the first difference being outside the allowable range may be output.

The method may further include receiving image data of a structure including the second patterned layer on the first patterned layer; determining, based on the image data of the structure, a second difference in overlay between the first and second patterned layers; and comparing the second difference with the first difference to establish a reliability of the first data.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Figure 1:
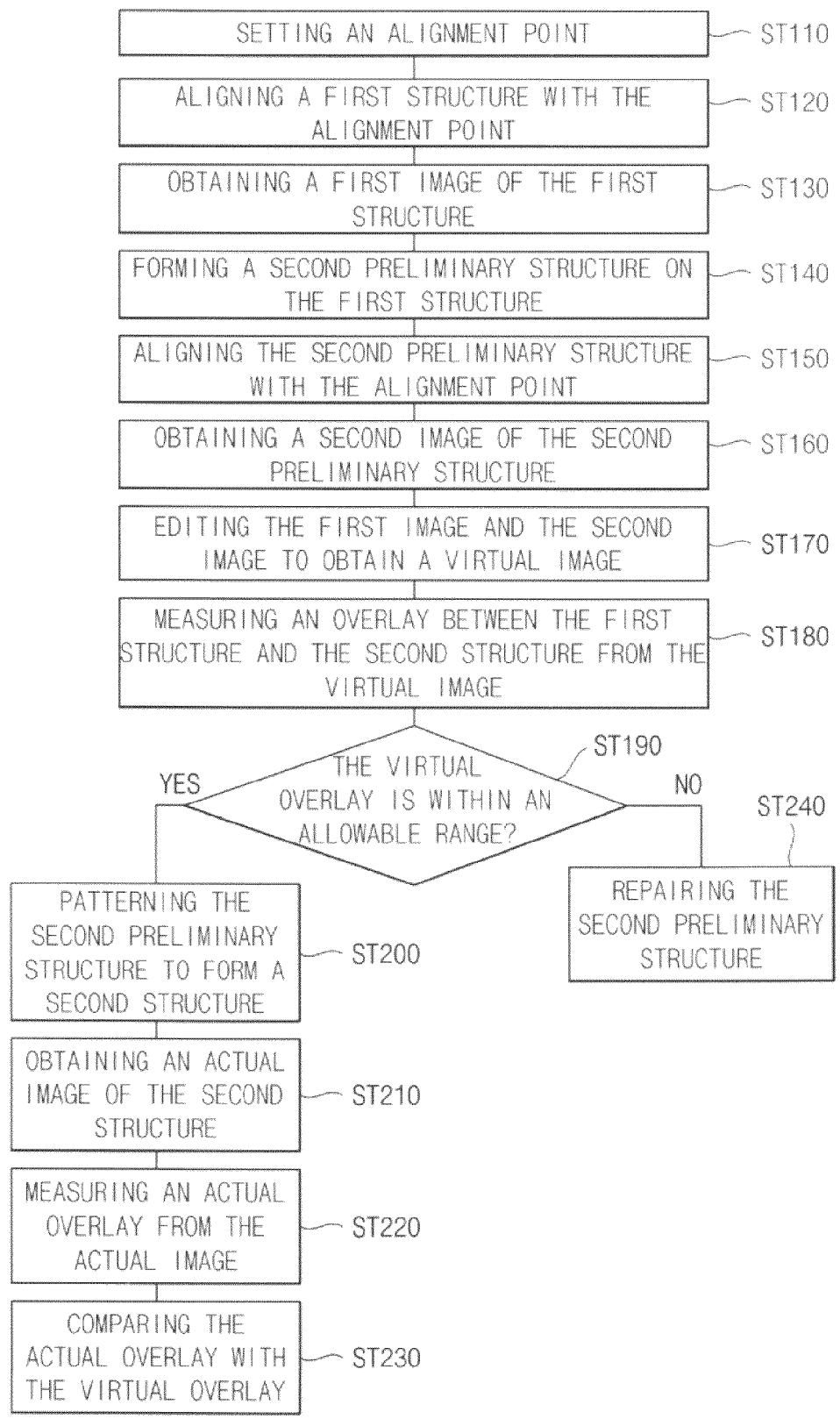
FIG. 1 is a flow chart illustrating a method of measuring an overlay of an object in accordance with an exemplary embodiment of the inventive concept.

Exemplary embodiments of the inventive concept will be described more fully hereinafter with reference to the accompanying drawings. The present inventive concept may, however, be embodied in many different forms and should not be construed as limited to the exemplary embodiments set forth herein. In the drawings, the sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout the drawings and specification.

FIG. 1 is a flow chart illustrating a method of measuring an overlay of an object in accordance with an exemplary embodiment of the inventive concept.

Referring to FIG. 1, in step ST110, an alignment point used for measuring an overlay may be set. In an exemplary embodiment of the inventive concept, the alignment point may be marked on a semiconductor substrate and set to a coordinate of a position on a stage in an overlay measurement tool on which the semiconductor substrate may be placed. The stage may be a wafer or reticle stage.

In step ST120, a first structure formed on the semiconductor substrate may be aligned with respect to the alignment point. In an exemplary embodiment of the inventive concept, the first structure may include a first patterned layer. The first patterned layer may be formed by forming a lower layer on the semiconductor substrate, forming a photoresist pattern on the lower layer, and etching the lower layer using the photoresist pattern as an etch mask.

Figure 2:
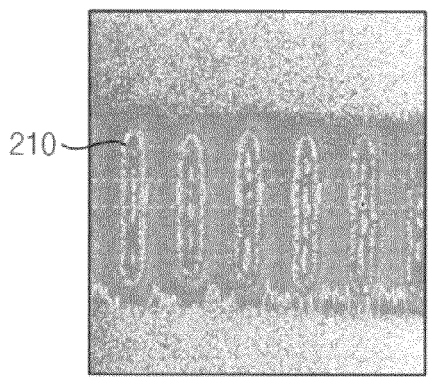
FIG. 2 is a scanning electron microscope (SEM) picture showing a first image of a first patterned layer, according to an exemplary embodiment of the inventive concept.
Figure 6:
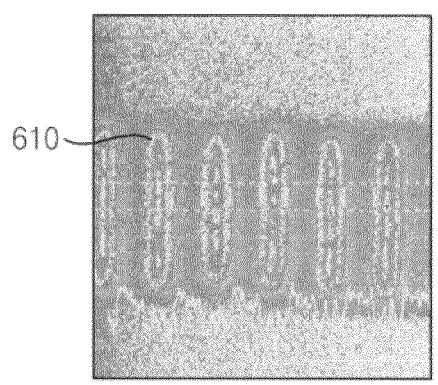
FIG. 6 is an SEM picture showing a first image of a first patterned layer, according to an exemplary embodiment of the inventive concept.

In step ST130, first information of the first patterned layer may be obtained. In an exemplary embodiment of the inventive concept, the first information may include a first image as shown in FIG. 2 or 6. The first image may be obtained using a scanning electron microscope (SEM) and associated equipment. The first image in FIGS. 2 and 6 includes oval patterns 210 and 610 of the first patterned layer.

In step ST140, a second preliminary structure may be formed on the first structure. In an exemplary embodiment of the inventive concept, the second preliminary structure may include a second non-patterned layer, and a photoresist pattern formed on the second non-patterned layer. In other words, the second non-patterned layer may correspond to an upper layer that has not yet undergone an etching process using the photoresist pattern formed on the second non-patterned layer.

In step ST150, the semiconductor substrate may be placed on the stage, if this had not yet been done. The stage may be aligned such that the coordinate matches the alignment point. Thus, the second preliminary structure may be aligned with respect to the alignment point. On the other hand, if the semiconductor substrate had already been placed on the stage and aligned thereto, the second preliminary structure may be aligned with the alignment point by matching the second preliminary structure to patterns of the first structure.

Figure 3:
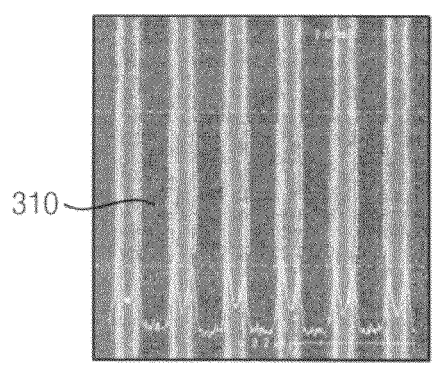
FIG. 3 is an SEM picture showing a second image of a second non-patterned layer aligned with the first patterned layer in FIG. 2, according to an exemplary embodiment of the inventive concept.
Figure 7:
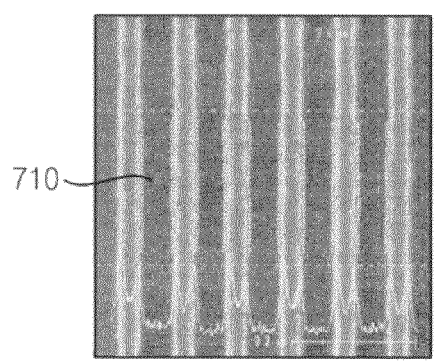
FIG. 7 is an SEM picture showing a second image of a second non-patterned layer non-aligned with the first patterned layer in FIG. 6, according to an exemplary embodiment of the inventive concept.

In step ST160, second information of the second preliminary structure may be obtained. In an exemplary embodiment of the inventive concept, the second information may include a second image as shown in FIG. 3 or 7. The second image in FIGS. 3 and 7 identifies openings 310 and 710 in the second preliminary structure.

Figure 4:
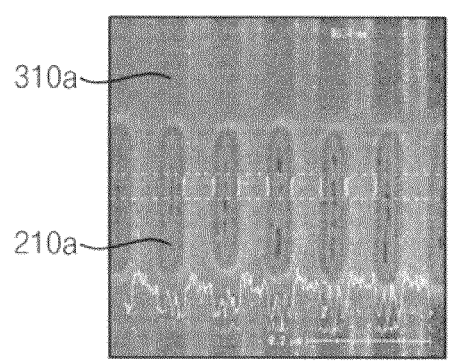
FIG. 4 is an SEM picture showing a virtual image obtained by editing the first image in FIG. 2 and the second image in FIG. 3, according to an exemplary embodiment of the inventive concept.
Figure 8:
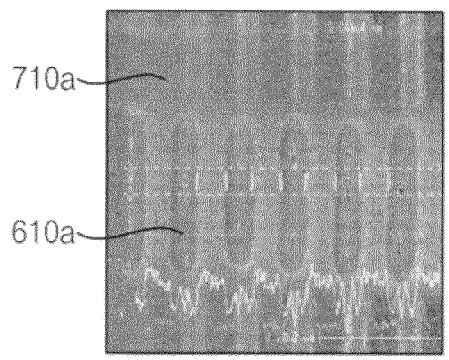
FIG. 8 is an SEM picture showing a virtual image obtained by editing the first image in FIG. 6 and the second image in FIG. 7, according to an exemplary embodiment of the inventive concept.

In step ST170, the first image and the second image may be edited with each other to obtain virtual information. In an exemplary embodiment of the inventive concept, the virtual information may include a virtual image as shown in FIG. 4 or FIG. 8. The virtual image may include the virtual information of a structure that would result when a second patterned layer is formed by etching the second non-patterned layer using the photoresist pattern formed on the second non-patterned layer as an etch mask and stacked on the first patterned layer. Thus, whether or not the first patterned layer may be accurately exposed through an opening of the second patterned layer may be identified from the virtual image.

In an exemplary embodiment of the inventive concept, the virtual image may be obtained using augmented reality technology. The augmented reality technology may combine virtual reality with a real image in accordance with movements of the real image. Therefore, prediction information of the second patterned layer, which may be formed by etching the second non-patterned layer using the photoresist pattern formed on the second non-patterned layer as an etch mask, may be combined with information of the first image and the second image to obtain the virtual image of the structure including the first patterned layer and the second patterned layer sequentially stacked.

In step ST180, a virtual overlay between the first structure and the second structure may be measured from the virtual image. In this case, an amount of shift of the second structure from its desired position on the first structure may be measured. In an exemplary embodiment of the inventive concept, an amount of shift of the first patterned layer in the opening of the second patterned layer of the virtual image may be measured. For example, in FIG. 4, the shift can be determined by measuring how much the oval 210a of the first patterned layer is shifted with respect to the opening 310a of the second patterned layer.

In step ST190, when the virtual overlay is within a predetermined allowable range, as is the case in FIG. 4, the process moves to step ST200, in which the second preliminary structure may be patterned to form the second structure.

As can be gleaned from FIG. 4, the photoresist pattern in the second image of FIG. 3 was accurately positioned on the first patterned layer. Thus, the second non-patterned layer may be etched using the accurately positioned photoresist pattern as an etch mask, and a desired portion of the first patterned layer may be accurately exposed through the opening of the second patterned layer.

Figure 5:
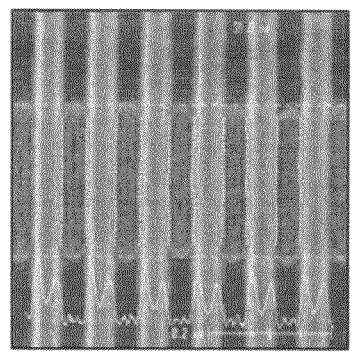
FIG. 5 is an SEM picture showing an actual image of a structure where a second patterned layer formed by patterning the second non-patterned layer in FIG. 3 is arranged on the first patterned layer in FIG. 2, according to an exemplary embodiment of the inventive concept.

Additionally, in step ST210, an actual image of the second structure may be obtained. An example of the actual image is shown in FIG. 5. In step ST220, an actual overlay between the first patterned layer and the second patterned layer may be measured from the actual image. In step ST230, the actual overlay may be compared with the virtual overlay to measure a difference between the actual overlay and the virtual overlay.

In an exemplary embodiment of the inventive concept, the processes from ST210 to ST230 may be performed to identify the reliability of the virtual overlay obtained from the virtual image. When the difference between the virtual overlay and the actual overlay is within an allowable range, e.g., a range in which a semiconductor fabrication process is normally effectuated, the virtual overlay may have a desired reliability. Therefore, the processes for obtaining the actual image, measuring the actual overlay and comparing the actual overlay with the virtual overlay may be omitted.

In contrast, in step ST190, when the virtual overlay is not within the allowable range, in step ST240, a repair process may be performed on the second preliminary structure.

For example, the photoresist pattern on the second non-patterned layer in the second image of FIG. 7 may be inaccurately positioned on the first patterned layer of FIG. 6. Thus, if the second non-patterned layer is etched using the inaccurately positioned photoresist pattern as an etch mask, a desired portion of the first patterned layer in the virtual image of FIG. 8 may not be accurately exposed through the opening of the second patterned layer. For example, in FIG. 8, only part of the oval 610a of the first patterned layer is exposed in the opening 710a of the second patterned layer.

Figure 9:
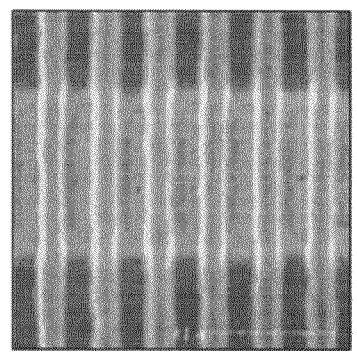
FIG. 9 is an SEM picture showing an actual image of a structure where a second patterned layer formed by patterning the second non-patterned layer in FIG. 7 is arranged on the first patterned layer in FIG. 6, according to an exemplary embodiment of the inventive concept.

In practice, it may be noted that the first patterned layer is not accurately exposed through the opening of the second patterned layer. An example of this can be gleaned from the image of FIG. 9, which shows an actual structure that was formed by etching the second non-patterned layer of FIG. 7 using the inaccurately aligned photoresist pattern as an etch mask. In many cases, such a structure would be discarded.

However, in accordance with an exemplary embodiment of the inventive concept, before etching the second non-patterned layer using the inaccurately aligned photoresist pattern, the misaligned photoresist pattern may be removed. A new photoresist pattern may then be formed on the second non-patterned layer. Steps ST150 to ST180 may be performed using the new photoresist pattern until the virtual overlay is within the allowable range.

As a result, before etching the second non-patterned layer, the misalignment of the photoresist pattern may be identified, so that only the photoresist pattern may be repaired, thus precluding the semiconductor substrate from being discarded.

According to an exemplary embodiment of the inventive concept, the overlay between upper and lower layers may be accurately measured from the virtual image before patterning a non-patterned layer of the upper layer. Thus, when a measured overlay indicates that the upper and lower layers are abnormally aligned, a repair process may be performed to correctly align the non-patterned layer with the lower layer.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of measuring an overlay of an object, the method comprising:
    obtaining first information of a first structure, wherein the first structure comprises a first patterned layer formed on a semiconductor substrate and the first information includes a real image of the first patterned layer;
    forming a preliminary structure on the first structure;
    obtaining second information of the preliminary structure, wherein the preliminary structure comprises a second layer formed on the first patterned layer and the second information includes a real image of the second layer, wherein the second layer has not yet undergone an etching process using a photoresist pattern formed on the second layer;
    overlaying the real image of the first patterned layer with the real image of the second layer to obtain a virtual image of the second structure that would be formed on the first structure if the etching process is performed on the preliminary structure; and
    measuring a virtual overlay between the first structure and the second structure using the virtual image.

2. The method of claim 1, further comprising aligning the first structure and the preliminary structure prior to obtaining the second information of the preliminary structure.

3. The method of claim 2, wherein aligning the first structure and the preliminary structure comprises:
    setting an alignment point;
    aligning the first structure with the alignment point; and
    aligning the preliminary structure with the alignment point.

4. The method of claim 1, wherein the second structure, once formed, comprises a second patterned layer formed by etching the second layer.

5. The method of claim 1, wherein the virtual image is obtained using augmented reality technology.

6. The method of claim 1, further comprising, in response to the virtual overlay being within an allowable range:
    performing the etching process on the preliminary structure to form the second structure.

7. The method of claim 6, further comprising performing another semiconductor fabrication process on the preliminary structure to form the second structure.

8. The method of claim 6, further comprising:
    obtaining third information of the second structure;
    measuring an actual overlay between the first structure and the second structure using the first information and the third information; and
    comparing the actual overlay with the virtual overlay.

9. The method of claim 8, wherein the third information comprises an image of the second structure.

10. The method of claim 1, wherein in response to the virtual overlay being outside an allowable range:
    repairing the preliminary structure.

11. The method of claim 10, further comprising:
    repeating the obtaining of the second information, processing and measuring steps using the repaired preliminary structure in place of the original preliminary structure; and
    forming the second structure in response to the overlay measured between the first structure and the repaired preliminary structure being within the allowable range.

12. A method of measuring an overlay of an object, the method comprising:
    aligning a first patterned layer with an alignment point;
    obtaining a first image of the first patterned layer;
    forming a second layer on the first patterned layer, wherein the second layer has not yet undergone an etching process using a photoresist pattern formed on the second layer;
    aligning the second layer with the alignment point;
    obtaining a second real image of the second layer;
    combining the first real image and the second real image to obtain a virtual image of a structure that would result if a second patterned layer were to be formed by etching the second layer in its aligned position an the first patterned layer; and
    measuring a virtual overlay between the first patterned layer and the second patterned layer using the virtual image.

13. The method of claim 12, further comprising, in response to the virtual overlay being within an allowable range:
    etching the second layer to form the second patterned layer; otherwise, realigning the second layer until the virtual overlay is within the allowable range.

14. The method of claim 13, wherein the first patterned layer is formed on a semiconductor substrate and the second patterned layer overlaps the first patterned layer.

15. The method of claim 12, wherein the alignment point is located on the semiconductor substrate.

16. An overlay measurement method, comprising:
    receiving image data of a first patterned layer formed on a semiconductor substrate, wherein the first patterned layer is aligned with an alignment point corresponding to a coordinate of a device on which the semiconductor substrate is disposed;
    receiving real image data of a second layer formed on the first patterned layer and aligned with the alignment point, wherein the second layer has not yet undergone an etching process using a photoresist pattern formed on the second layer;
    combining the real image data of both layers to produce first data, wherein the first data is indicative of what would occur if the second layer were etched in its current location to form a second patterned layer on the first patterned layer;
    determining, based on the first data, a first difference in overlay between the second patterned layer and the first patterned layer; and
    outputting an instruction to form the second patterned layer in response to the first difference being within an allowable range and an instruction to adjust the second layer in response to the first difference being outside the allowable range.

17. The method of claim 16, further comprising:
    receiving image data of a structure including the second patterned layer on the first patterned layer;
    determining, based on the image data of the structure, a second difference in overlay between the first and second patterned layers; and
    comparing the second difference with the first difference to establish a reliability of the first data.

* * * * *